(12) United States Patent
Reiner

(10) Patent No.: US 6,765,773 B2
(45) Date of Patent: Jul. 20, 2004

(54) ESD PROTECTION FOR A CMOS OUTPUT STAGE

(75) Inventor: Joachim Christian Reiner, Thalwil (CH)

(73) Assignee: Koninklijke Philips Electronics N.V., Eindhoven (NL)

(*) Notice: Subject to any disclaimer, the term of this patent is extended or adjusted under 35 U.S.C. 154(b) by 64 days.

(21) Appl. No.: 10/222,235

(22) Filed: Aug. 16, 2002

(65) Prior Publication Data

US 2003/0042499 A1 Mar. 6, 2003

(30) Foreign Application Priority Data

Aug. 21, 2001 (DE) .......................... 101 39 956

(51) Int. Cl.[7] .............................................. H02H 9/00
(52) U.S. Cl. ........................................................ 361/56
(58) Field of Search ............................................. 361/56

(56) References Cited

FOREIGN PATENT DOCUMENTS

JP 361129855 * 6/1986

* cited by examiner

*Primary Examiner*—Stephen W. Jackson
*Assistant Examiner*—James Demakis
(74) *Attorney, Agent, or Firm*—Peter Zawilski

(57) ABSTRACT

The invention relates to an arrangement for improving the ESD protection in an integrated circuit. In order to achieve an effective use of chip area, it is proposed to connect a passive component between the bonding pad and an integrated circuit, said passive component being arranged over an electrically non-conductive layer and under the bonding pad. In the event of damage to the bonding pad when bonding or testing, only the passive component, at most, is short-circuited, but the functionality of the output driver stage and of the integrated circuit remains unaffected.

10 Claims, 3 Drawing Sheets

ESD PROTECTION FOR A CMOS OUTPUT STAGE

The invention relates to an arrangement for improving the ESD protection in an integrated circuit.

In integrated circuits CMOS output driver stages or CMOS buffers are used to provide a corresponding amplification of a signal to be output by the integrated circuit. They are used, for example, in display devices in activation or driver circuits.

Electrostatic discharges (ESD) are one of the most destructive, unavoidable environmental influences to which electronic systems and integrated circuits are exposed. For example, in the event of ESD, integrated circuits must conduct currents in the order of several amps within a few nanoseconds. The destructive influence of these current densities on the circuit lies, on the one hand, in the very high thermal power dissipation in relation to the size of the circuit element, whilst on the other hand overvoltages which can destroy thin oxides are generated on the chip. From the point of view of circuit development in modern VLSI processes, overcoming these parasitic effects is becoming the central problem, since miniaturization increases the sensitivity to ESDs.

Electrostatic charges are produced by friction between materials, as can be caused by walking on carpets. Build-up and storage of the charge can lead to electrostatic potentials of several kV. When they come into contact with highly integrated semiconductor components these stored charges are discharged, a phenomenon also referred to as electrostatic discharge (ESD). From an electrical standpoint, electrostatic discharges represent transient high-current events with a peak current of several amps, lasting from 10 ns to 300 ns. These transient currents are a threat to integrated circuits in various ways:

- on the one hand, the electrical overloads can destroy the integrated circuit due to overheating,
- on the other hand, an overvoltage can cause gate oxide breakdowns in the MOS gates,
- in addition, repeated ESD loads can give rise to degradation phenomena, which lead to an increase in the leakage currents.

Regardless of the type of ESD load, the semiconductor component or the integrated circuit either sustains irreparable damage or its capacity to function becomes deficient or deteriorates.

With increasing integration density of CMOS processes, there is also an increased risk of failures in integrated circuits that can be attributed to destruction by electrostatic discharges.

Known ESD protection circuits are designed to limit the voltage, The actual circuit to be protected must have a corresponding resistance to overvoltages.

With ever-increasing miniaturization of integrated circuits it is also particularly necessary to make effective use of the available chip area.

WO 0048252 describes an arrangement in which components are arranged under the bonding pad. These are arranged, in particular, under the edge of the bonding pad, since the least damage due to mechanical stress occurs there. These components are formed by differently doped layers, so that under the bonding pad there are areas which have different electrical potentials. If the bonding pad is damaged, short-circuits between these different potentials can impair the functionality of the circuit.

Locating components under the bonding pads of the CMOS circuit carries the disadvantage that the connection of the bonding pad to the terminals of a circuit package or lead frame by means of bonding, for example, exerts a mechanical stress on the bonding pad, so that the layers situated under the bonding pad, including active components, may be destroyed, with the result that the functionality of the integrated circuit is not assured.

Therefore, it is an object of the invention to provide an arrangement which permits an effective utilization of the chip surface area with improved ESD protection of the integrated circuit, and which ensures that the functionality of the integrated circuit is not impaired in the event of mechanical stressing of a bonding pad.

According to the invention this object is achieved by an arrangement for improving the ESD protection in an integrated circuit, in which a passive component, which is arranged under a bonding pad and over a non-conductive layer, is connected between the bonding pad and the integrated circuit.

In order to afford CMOS circuits adequate ESD protection, very large resistors are usually necessary, which take up a lot of space on the chip surface. A typical output stage of a CMOS circuit comprises at least one bonding pad, one PMOS transistor and one NMOS transistor, which are both connected in such a way that they form an output driver stage. In addition, an ESD protection circuit is generally also connected. A number of diodes can also be connected to the various potentials.

The ESD protection circuit limits the voltage in the event of an ESD. Owing to the snapback phenomenon, the NMOS transistor of the output driver stage is particularly at risk of being destroyed by the large current flowing in the event of an ESD. Further measures are needed in order to limit this current. One known method of doing this is to connect a resistor in series with the NMOS transistor, thereby limiting the current. Since this resistor should have a sufficiently high resistance to current, however, it needs to be correspondingly large. In highly miniaturized circuits, however, space on the actual chip surface is extremely limited. For this reason it is proposed to locate a passive component under the bonding pad for the additional protection of the NMOS transistor.

A connecting wire is bonded to the bonding pad. This wire connects the corresponding bonding pad of the integrated circuit to the terminal on the package/lead frame of the integrated circuit. Compared to the ESD protection circuit or the output driver circuit, the bonding pad takes up the most space in the output stage. During testing of the circuit, the bonding pad is exposed to mechanical stress by test needles. The bonding process also subjects the bonding pad to a high mechanical stress, due to the contact pressure required and the ultrasonic cold welding of the metal of the bonding ball to that of the bonding pad. As a result cracks can occur in the underlying layers, which cracks affect the functionality within these layers due to leakage currents, short-circuits or breaks, for example. For this reason, components have hitherto not been located directly under the bonding pads, or only where there was readiness to accept reduced reliability.

According to the invention, a passive component, which is connected between the NMOS transistor and the bonding pad, is located under the bonding pad. The bonding pad is formed by several metal layers, which are connected by electrically conductive connectors or VIAs. These VIAs also have a mechanical stabilizing effect when the bonding pad is subjected to load stresses. According to the invention, a passive component, one terminal of which is connected to the bonding pad by way of a VIA, is arranged under these metal layers. Connected to the other terminal of the passive component is the integrated circuit, in particular the output driver stage. This ensures that in the event of an ESD a high current flow is limited by means of the passive component. Arranging the passive component under the metal layers means that, if the metal layers are destroyed or damaged by mechanical pressure acting on the bonding pad, at worst only leakage current paths are created which bridge the passive component in that, for example, an insulating layer develops cracks through which metal could be pressed, thereby bridging the passive component. This leakage current path, however, does not affect the functionality of the ESD protection circuit, the output driver circuit or the integrated circuit. For this purpose preferably only the passive component is arranged under the bonding pad; moreover, it is arranged on an electrically non-conductive layer, so that in the event of damage and any short-circuit, no further components can be short-circuited, thus impairing the functionality.

In a preferred embodiment it is proposed to segment the passive component. This ensures that under heavy mechanical pressure the passive component is not destroyed, any propagation of cracks being prevented by the segmentation. In the event of any damage to the metal layer, it is ensured that although a part of the passive component is bridged, the functionality of the CMOS output driver stage is not impaired. Segmentation means that the passive component is not formed from a coherent area, but from a plurality of small sub-areas.

The non-conductive layer is preferably formed over an n-(p-) doped layer in a p-(n-) doped substrate, so that in the event of damage and cracking of the non-conductive layer under the passive component, this correspondingly doped layer forms a barrier against further short-circuits.

It is also advantageous to form the passive component as a weakly n-doped layer under an insulating field oxide layer. Since the weakly n-doped layer has a high resistance, little space is thereby taken up. It is also possible to arrange the field oxide over a p-doped layer.

In one particular embodiment the passive component takes the form of a polysilicon resistor. This polysilicon resistor is arranged over an insulating field oxide layer. In order to separate the resistor from other electronic structures, it is proposed to arrange a weakly n-(p-) doped layer in the p-(n-) doped substrate under the field oxide layer that lies under the resistor.

The use of polysilicon is advantageous since no additional diffusion layer is needed in the substrate, which in an unfavorable arrangement might lead to a latch-up sensitivity of the output driver stage. The advantageous location of a weakly n-(p-) doped layer in the p-(n-) doped substrate under the field oxide layer, moreover, increases the tolerance to short-circuiting due to mechanical stresses should a crack extend as far as the field oxide layer. In such a case, the transition between the weakly (p-) doped layer and the p-(n-) doped substrate forms a barrier In a further advantageous embodiment of the invention it is proposed to connect multiple resistors between the NMOS transistor and the bonding pad. The terminal connections between the VIA and the resistor connection in each case also form a resistance, which in the event of an ESD can help to limit any excessive current flow. In the case of an appropriate choice of the material, it is now possible to select a poorly conducting material, thereby forming a large resistor, which takes up little space.

A resistor can also be built up from other layers, such as an n-well doped layer in a p-doped layer or as n+ -doped layer over a p-doped layer or p+ doped layer over an n-doped layer. A metal layer over a field oxide layer is likewise feasible. At the same time a resistor formed from n-well under the field oxide layer has even better protection against mechanical stresses. In an embodiment of a resistor comprising n+ or p+ doped layers, the resistance layer is not covered by a field oxide and lies deeper and hence more protected that would a polysilicon layer. It is also possible for the resistor to take the form of a metal layer, since in the event of damage to the bonding pad only the resistor, at most, could be short-circuited. It is likewise possible to combine the above types of resistor, so that, for example, a polysilicon resistor is formed under the bonding pad, the resistor outside the bonding pad, however, being connected in series with a resistor in an n-well area.

It is also possible to have the metal 1 layer form the resistor. With the contemporary CMOS technology this layer is preferably formed from tungsten, so that owing to the high resistance of tungsten little area is needed to form a large resistor, or a very large resistor can be formed under the entire area of the bonding pad.

For high-frequency applications it is advantageous to design the passive component under the bonding pad as a capacitor or coil; these components will not affect the functionality of the integrated circuit not even in the event of a high-resistance leakage current path.

The object is also achieved by an arrangement for the activation of a display device having a CMOS driver circuit. Since the voltages needed to activate displays generally exceed the operating voltages, the necessary voltages must be provided by driver circuits and any charge pumps. An arrangement as described above is also, among other things, needed for this purpose.

The invention will be further described with reference to embodiments as shown in the drawings to which, however, the invention is not restricted, and in which.

Figure 1:
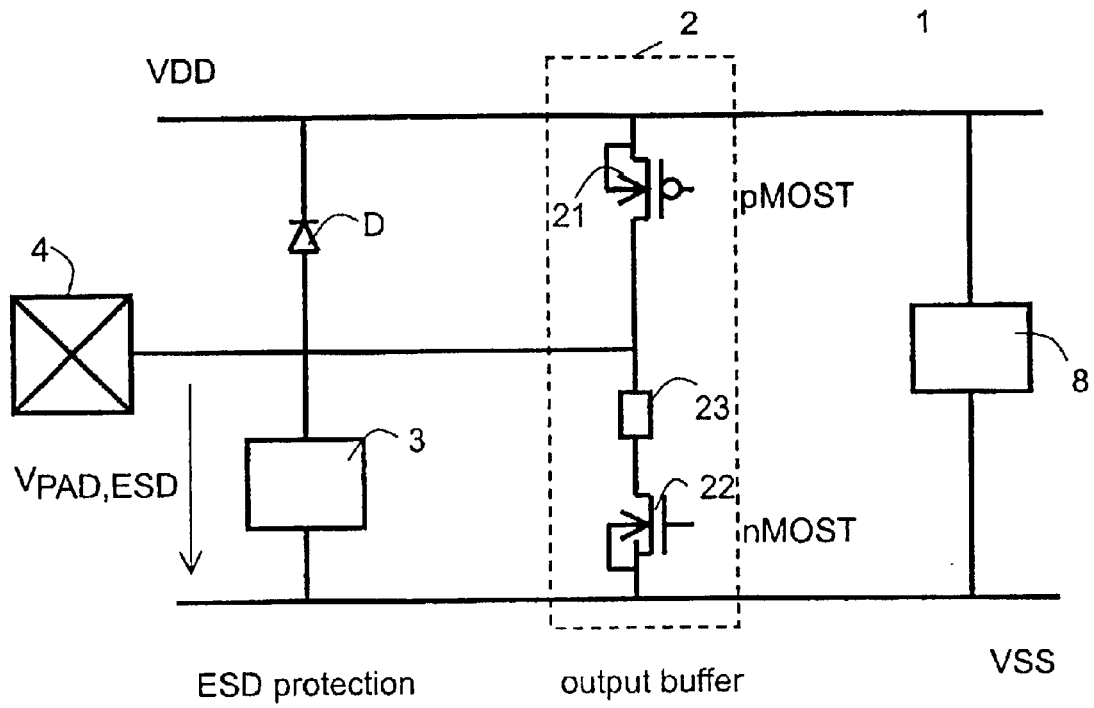
FIG. 1 is a schematic representation of a CMOS output stage

FIG. 1 is a simplified representation of a CMOS output stage 1. The output driver stage 2 comprises at least one PMOS transistor 21, which is connected in series with the NMOS transistor 22. The two transistors are typically connected between Vdd and Vss. In the event of an ESD a very large current flows via the NMOS transistor 22, so that this transistor might possibly be destroyed. In order to limit this current, a resistor 23 is connected between the two transistors. This resistor is connected on one side to the drain connection of the NMOS transistor 22. The other side of the resistor 23 is connected to the PMOS transistor 21 and the bonding pad 4. Also connected between the bonding pad and Vss is an overvoltage circuit 3, which in the event of an ESD limits the voltage $V_{pad}$ on the bonding pad 4 to $V_{pad,esd}$. In addition an ESD protection circuit 8 is arranged between Vdd and Vss. A diode D is connected between the input/output of the integrated circuit and Vdd and constitutes an additional ESD discharge path via VDD and the protection circuit 8.

Figure 2:
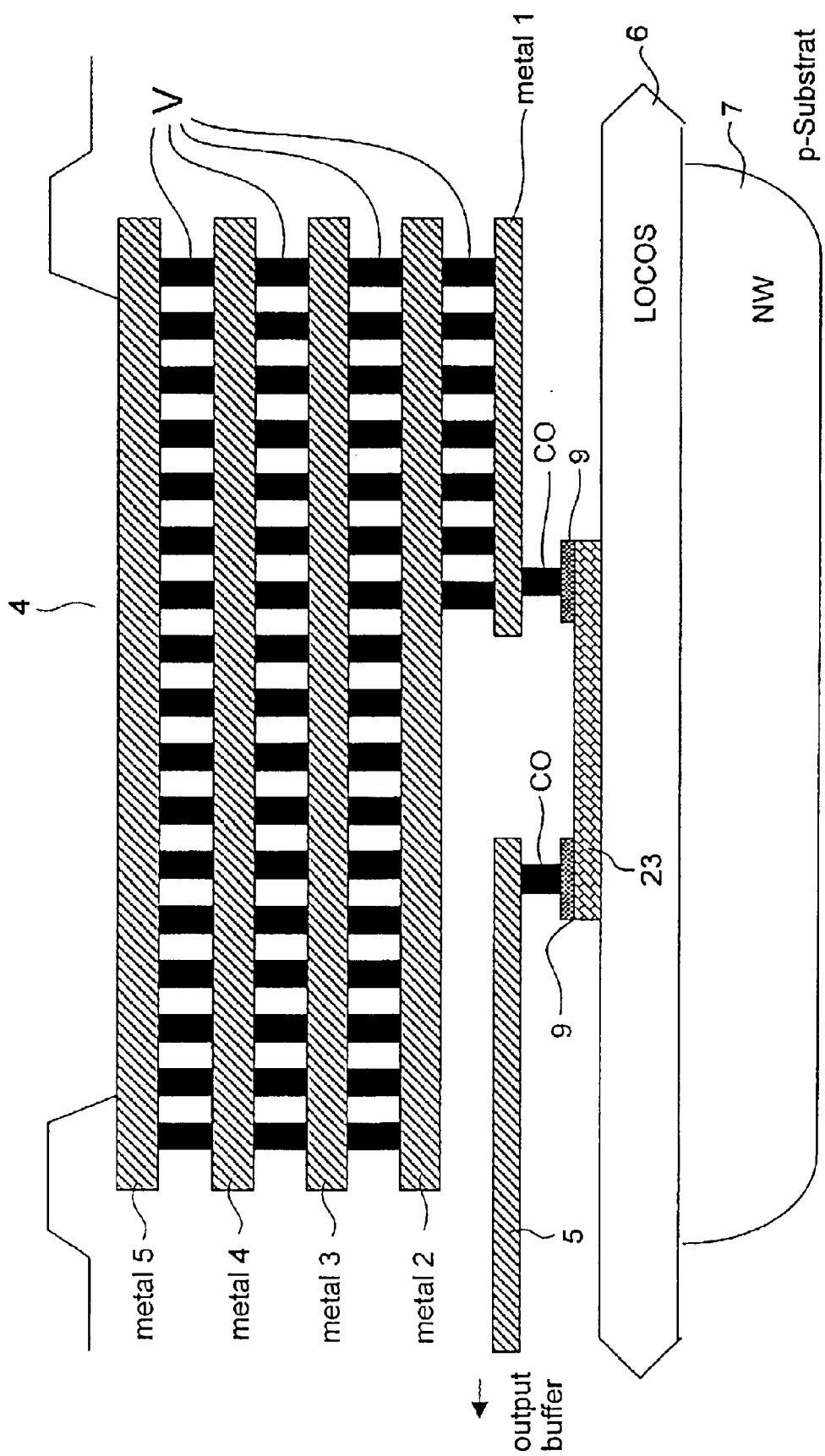
FIG. 2 shows a resistor under the bonding pad

FIG. 2 shows the arrangement of a resistor 23 under the bonding pad 4. The bonding pad is formed by multiple metal layers metal 1–5. These metal layers are connected by VIAS V, which are electrically conductive. The resistor 23 is connected to at least one contact VIA CO. The other side of the resistor is connected to the output driver stage 2. A field oxide layer 6, which is electrically non-conductive, is arranged under the resistor 23. This field oxide layer 6 is arranged over an n-well area 7, which is imbedded in a weakly p-doped substrate. The contact VIAs are fixed to silicide layers 9. These silicide layers 9 also have an electrical resistance. A SIPROT mask has been used to ensure that the area 10 between the silicide layers 9 is not covered with suicide. Since silicide has a lower resistance than polysilicon, the resistance value would be unnecessarily reduced by a polysilicon resistor 23 completely covered with silicide.

In the event of damage to the layer structure it may happen that the insulating layer between metal 2 and metal 1/connection path 5 develops cracks, through which the metal layers can be pressed possibly giving rise to a leakage current path between the metal layer metal 2 and the connection path 5 of the output driver stage. This is equivalent to a short-circuit of the resistor 23. Due to this short-circuit this resistor 23 is bridged, but the functionality of the output driver stage and of an integrated circuit, not shown, are not impaired. Since the resistor is arranged over an insulating field oxide layer 6, the short-circuit cannot extend to other active areas. Apart from the resistor, no other components, the functionality of which might be impaired, are arranged under the bonding pad 4. As a rule, due to their generally small spatial extent, leakage current paths which occur as a result of mechanical damage to the insulating layer have a relatively high resistance, typically in the order of a few kOhms. Since the resistance proposed here has values of approximately 1 to 1000 Ohm, such a leakage current path has only an insignificant effect on the functioning of the output stage. This is in contrast to a leakage current path between the bonding pad and VDD or VSS, for example, where leakage current paths with a resistance of 1 MegaOhm will mean that a typical CMOS component no longer meets the maximum leakage current specification of approximately 1 $\mu$A and hence fails electrically.

Figure 3:
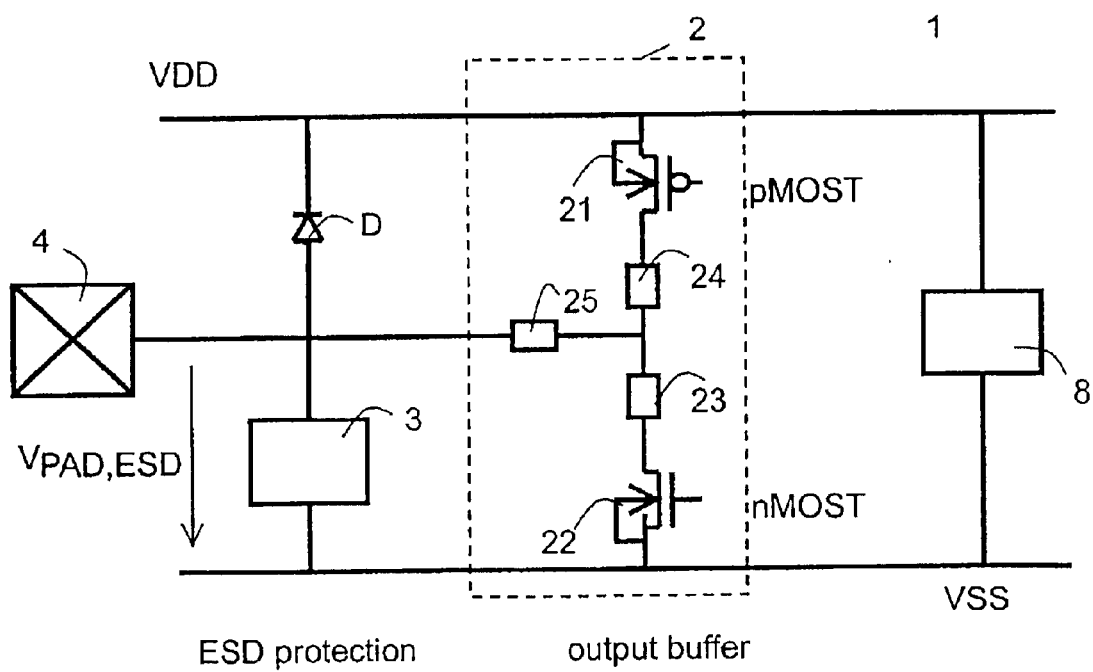
FIG. 3 shows multiple resistors in a schematic representation
Figure 4:
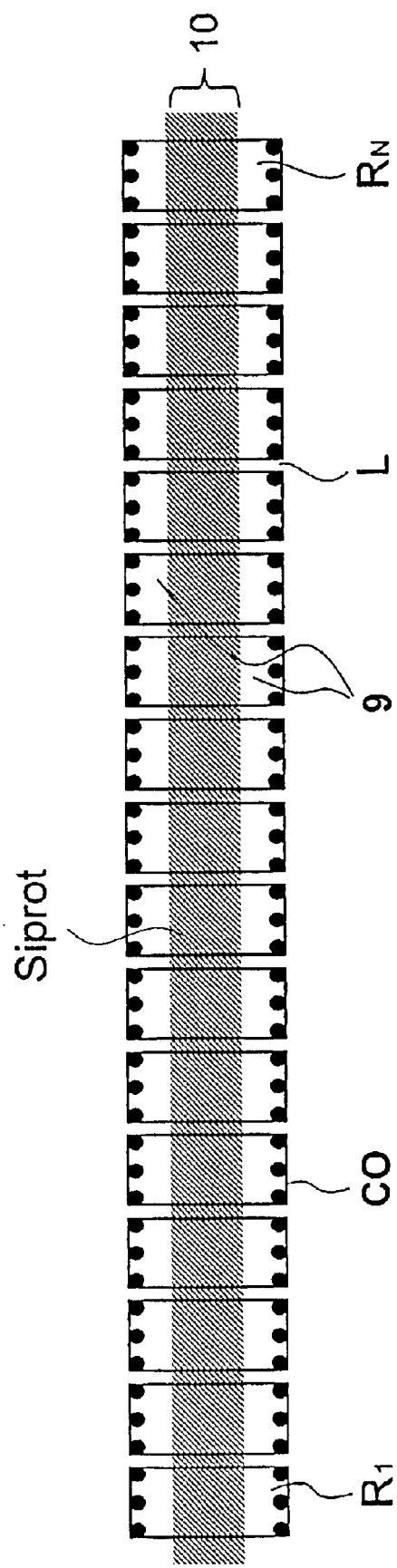
FIG. 4 shows a segmented resistor

FIG. 3 shows a representation with a plurality of resistors which are connected to one another in such a way that one larger resistor is formed. According to the invention, at least some of these resistors 23, 24, 25 may be arranged under the bonding pad 4. FIG. 4 shows a segmented resistor. Here the sub-areas $R_1$–$R_n$ are formed from polysilicon. These areas $R_1$–$R_n$ are connected to one another by means of a silicide layer 9 on both sides of the contacts CO. At the same time the formation and also the width of the silicide layer is localized by means of a SIPROT mask. The magnitude of the resistance can be adjusted by the choice of material of the contacts CO to the metal layer metal 1 and the width of the non-silicided area of the resistor. The areas $R_1$–$R_n$ are arranged with gaps L between the areas, so that in the event of cracking a crack cannot spread through the entire resistor.

The SIPROT mask prevents the application of the silicide layer, since this silicide layer is low-resistance (approx. 5 Ohms/square) and would keep the resistance value low. The SIPROT mask provides locally unsilicided polysilicon of approximately 100 Ohms/square.

The actual example represents a CMOS output which can be used as a display driver output but also as a data output of a logic chip.

What is claimed is:

1. An arrangement for improving the ESD protection of an integrated circuit in which a passive component, which is formed under a bonding pad and over an electrically non-conductive layer, is connected between the bonding pad and the integrated circuit, the arrangement characterized in that in order to form an output driver stage, the integrated circuit has at least one PMOS transistor and one NMOS transistor connected in series therewith, and that the passive component is arranged tween the PMOS and the NMOS transistor and is intended to reduce a current without destroying the NMOS transistor in the event of an ESD.

2. An arrangement as claimed in claim 1, characterized in that the bonding pad is formed from a plurality of metal layers, the metal layers being connected to one another by way of electrically conductive and mechanically stabilizing connectors (VIAS) and one connection of the passive component being connected to at least one of these metal layers and its other connection to the output driver stage.

3. An arrangement as claimed in claim 1, characterized in that in the event of damage to at least some of the metal layers and an at least partial short-circuit between metal layers of the bonding pad and the connection path to the integrated circuit, the functionality of the output driver stage and/or of the integrated circuit is maintained.

4. An arrangement as claimed in claim 1, characterized in that the passive component is of segmented design in order to counteract any cracking.

5. An arrangement as claimed in claim 1, characterized in that the electrically non-conductive layer is arranged over an n-doped or p-doped substrate.

6. An arrangement as claimed in claim 1, characterized in that the passive component is formed by a resistive layer of polysilicon and forms at least one resistor.

7. An arrangement as claimed in claim 6, characterized in that the resistive layer is formed from a metal.

8. An arrangement as claimed in claim 1, characterized in that the passive component takes the form of at least one capacitor.

9. An arrangement as claimed in claim 1, characterized in that the passive component takes the form of at least one coil.

10. An arrangement for the activation of display devices having an arrangement as claimed in the claim 1.

* * * * *